(12) United States Patent
Wicker et al.

(10) Patent No.: US 8,062,921 B2
(45) Date of Patent: Nov. 22, 2011

(54) PHASE CHANGE MEMORIES WITH IMPROVED PROGRAMMING CHARACTERISTICS

(75) Inventors: Guy C. Wicker, Southfield, MI (US); Carl Schell, Dearborn, MI (US); Sergey A. Kostylev, Bloomfield Hills, MI (US); Stephen J. Hudgens, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 377 days.

(21) Appl. No.: 12/364,698

(22) Filed: Feb. 3, 2009

(65) Prior Publication Data

US 2009/0142882 A1      Jun. 4, 2009

Related U.S. Application Data

(62) Division of application No. 11/709,520, filed on Feb. 22, 2007, now Pat. No. 7,504,675.

(51) Int. Cl.
*H01L 21/00* (2006.01)

(52) U.S. Cl. ... 438/95; 438/238; 438/381; 257/E21.006; 257/E21.253; 257/E21.316; 257/E21.645; 257/E21.646

(58) Field of Classification Search .............. 438/95, 438/93, 96, 97, 238, 289, 381, 278; 257/E21.006, 257/253, 316, 645, 646
See application file for complete search history.

(56) References Cited

U.S. PATENT DOCUMENTS

| 5,166,758 | A  | * | 11/1992 | Ovshinsky et al. | ............... 257/3 |
| 5,341,328 | A  | * | 8/1994  | Ovshinsky et al. | ........... 365/163 |
| 5,414,271 | A  | * | 5/1995  | Ovshinsky et al. | ............... 257/3 |
| 5,534,711 | A  | * | 7/1996  | Ovshinsky et al. | ............... 257/3 |
| 6,819,469 | B1 | * | 11/2004 | Koba | ........................ 359/290 |
| 7,504,675 | B2 | * | 3/2009  | Wicker et al. | ................. 257/214 |

* cited by examiner

*Primary Examiner* — David Nhu
(74) *Attorney, Agent, or Firm* — Trop, Pruner & Hu, P.C.

(57) ABSTRACT

A phase change memory may be made with improved speed and stable characteristics over extended cycling. The alloy may be selected by looking at alloys that become stuck in either the set or the reset state and finding a median or intermediate composition that achieves better cycling performance. Such alloys may also experience faster programming and may have set and reset programming speeds that are substantially similar.

5 Claims, 1 Drawing Sheet

PHASE CHANGE MEMORIES WITH IMPROVED PROGRAMMING CHARACTERISTICS

CROSS-REFERENCE TO RELATED APPLICATIONS

This application is a divisional of U.S. patent application Ser. No. 11/709,520, filed on Feb. 22, 2007, which issued as U.S. Pat. No. 7,504,675.

BACKGROUND

This relates generally to phase change memories using chalcogenide alloys.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
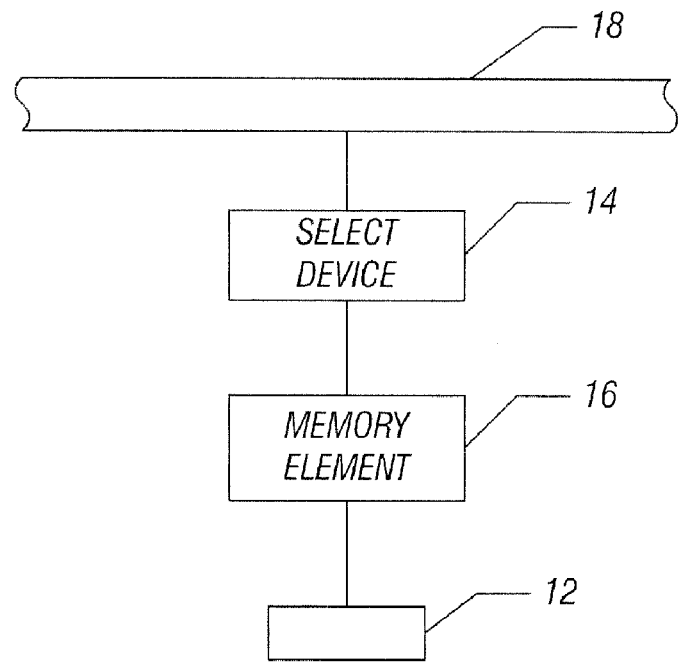
FIG. 1 is a depiction of memory cell in accordance with one embodiment of the present invention.

Phase change memories use chalcogenide alloys as the storage element. Phase change memories are potentially low cost, non-volatile memories with many performance advantages compared to conventional stored charge flash memory technology.

Two common cycling failure modes of chalcogenide alloy based phase change memory devices are failure to the stuck set state or to the stuck reset state. Normally, one of these failure modes is predominant in devices using a given chalcogenide alloy. The specific failure mode depends on the phase change alloy selected.

In connection with alloys that fail to the reset state with cycling, the current needed to reset the bit goes down during cycling until the bit remains stuck in the reset state.

Conversely, in alloys that eventually fail to the set state with cycling, the current needed to reset the bit goes up with cycling until the bit fails by remaining stuck in the set state.

Alloys with characteristics between those alloys that fail stuck in the reset state and alloys that fail stuck in the set state compensate for the reset current drift. By selecting an alloy having characteristics between the alloys that tend to stick reset and that tend to stick set, the overall drift and the reset current may be reduced. The cycle life of the devices may also be dramatically increased in some cases. It is not necessary to physically mix two alloys, but, rather, to design an alloy with characteristics between alloys that stick in a set state and alloys that stick in the reset state.

For example, the alloy $Ge_{35}Te_{45}Se_{11}Sb_8$ tends to stick in the reset state with cycling. The alloy $Ge_{37}Te_{23}Se_{33}Sb_8$ tends to stick in the set state. An advantageous alloy is one with 36 weight percent Ge, 34 weight percent Te, 22 weight percent Se, and 8 weight percent Sb. It has the formula $Ge_{36}Te_{34}Se_{22}Sb_8$. Alloys with 20 to 40 weight percent Germanium, 30 to 40 weight percent Tellurium, 15 to 25 weight percent Selenium, and 0 to 20 weight percent Antimony may be advantageous. As some specific examples, the following compositions may have advantageous properties: 35.9% Germanium, 36.7% Tellurium, 19.3% Selenium, and 8% Antimony; 36.2% Germanium, 31.1% Tellurium, 24.8% Selenium, and 7.9% Antimony; or 32.4% Germanium, 31.1% Tellurium, 19.3% Selenium, and 17.2% Antimony.

The alloy compositions with better performance on cycling may also be capable of relatively fast crystallization. Typical devices using conventional GeSbTe (GST) phase change alloys may have fairly asymmetric programming characteristics. The reset programming typically occurs very rapidly, but set state programming can require programming pulses of extended duration, for example, on the order of several hundred nanoseconds. This extended programming duration to the set state limits the usefulness of these devices as non-volatile replacements for dynamic random access memory.

For bits programmed to a saturated reset state (where the reset resistance is no longer increasing with increasing programming current), the set pulse width may be about 290 nanoseconds, which is much longer than the 50 nanoseconds pulse width to achieve the reset state. With the phase change alloys described herein, a set pulse width of about 20 nanoseconds may be capable of achieving a set state resistance of 20 kiloOhms, in some embodiments, when the preceding reset state is saturated. This is an improvement of 30 times the set speed compared to a conventional GST alloy and results in a device with essentially identical (symmetrical) set and reset speeds. Such a device has characteristics comparable to a dynamic random access memory.

Referring to FIG. 1, a series connected select device 14 may be used to access a memory element 16, including a phase change material, during programming or reading of memory element. Address lines 12 and 18 may be used to access a cell in an array of phase change memory cells. A select device may be an ovonic threshold switch that can be made of a chalcogenide alloy that does not exhibit an amorphous to crystalline phase change and which undergoes rapid, electric field initiated change in electrical conductivity that persists only so long as a holding voltage is present.

A select device may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state.

In the on state, the voltage across the select device is equal to its holding voltage $V_H$ plus IxRon, where Ron is the dynamic resistance from the extrapolated X-axis intercept, $V_H$. For example, a select device may have threshold voltages and, if a voltage potential less than the threshold voltage of a select device is applied across the select device, then the select device may remain "off" or in a relatively high resistive state so that little or no electrical current passes through the memory cell and most of the voltage drop from selected row to selected column is across the select device. Alternatively, if a voltage potential greater than the threshold voltage of a select device is applied across the select device, then the select device may "turn on," i.e., operate in a relatively low resistive state so that electrical current passes through the memory cell. In other words, one or more series connected select devices may be in a substantially electrically nonconductive state if less than a predetermined voltage potential, e.g., the threshold voltage, is applied across select devices. Select devices may be in a substantially conductive state if greater than the predetermined voltage potential is applied across select devices. Select devices may also be referred to as an access device, an isolation device, or a switch.

In one embodiment, each select device may comprise a switching material such as, for example, a chalcogenide alloy, and may be referred to as an ovonic threshold switch, or simply an ovonic switch. The switching material of select devices may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device may be a two terminal device that may have a current-voltage (I-V) characteristic similar to a phase change memory element that is in the amorphous state. However, unlike a phase change memory element, the switching material of select devices may not change phase. That is, the switching material of select devices may not be a programmable material, and, as a result, select devices may not be a memory device capable of storing information. For example, the switching material of select devices may remain permanently amorphous and the I-V characteristic may remain the same throughout the operating life.

In the low voltage or low electric field mode, i.e., where the voltage applied across select device is less than a threshold voltage (labeled $V_{TH}$), a select device may be "off" or non-conducting, and exhibit a relatively high resistance, e.g., greater than about 10 megaOhms. The select device may remain in the off state until a sufficient voltage, e.g., $V_{TH}$, is applied, or a sufficient current is applied, e.g., $I_{TH}$, that may switch the select device to a conductive, relatively low resistance on state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of a select device.

In the on state, the voltage potential across select device may remain close to the holding voltage of $V_H$ as current passing through select device is increased. The select device may remain on until the current through the select device drops below a holding current, $I_H$. Below this value, the select device may turn off and return to a relatively high resistance, nonconductive off state until the $V_{TH}$ and $I_{TH}$ are exceeded again.

In some embodiments, only one select device may be used. In other embodiments, more than two select devices may be used. A single select device may have a $V_H$ about equal to its threshold voltage, $V_{TH}$, (a voltage difference less than the threshold voltage of the memory element) to avoid triggering a reset bit when the select device triggers from a threshold voltage to a lower holding voltage called the snapback voltage. An another example, the threshold current of the memory element may be about equal to the threshold current of the access device even though its snapback voltage is greater than the memory element's reset bit threshold voltage.

Programming of the chalcogenide to alter the state or phase of the material may be accomplished by applying voltage potentials to the lower address line 12 and upper address line 18, thereby generating a voltage potential across the select device and memory element. When the voltage potential is greater than the threshold voltages of select device 14 and memory element 16, then an electrical current may flow through the chalcogenide in response to the applied voltage potentials, and may result in heating of the chalcogenide.

This heating may alter the memory state or phase of the chalcogenide. Altering the phase or state of the chalcogenide may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 2:
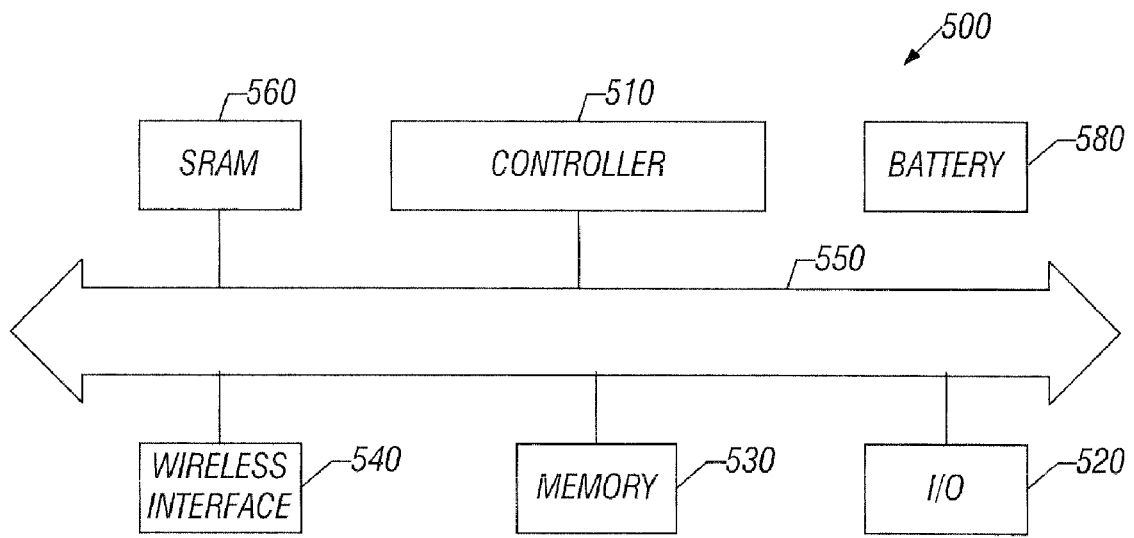
FIG. 2 is system depiction in accordance with one embodiment of the present invention.

Turning to FIG. 2, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of fabricating a phase change memory, the method comprising:

forming a semiconductor phase change memory using a chalcogenide alloy that has substantially identical set and reset programming speeds.

2. The method of claim 1 including forming a memory with an alloy having 20 to 40 weight percent Germanium.

3. The method of claim 2 including forming a memory with an alloy having 30 to 40 weight percent Tellurium.

4. The method of claim 3 including forming a memory with an alloy having 15 to 25 weight percent Selenium.

5. The method of claim 4 including forming a memory with an alloy having 0 to 20 weight percent Antimony.

* * * * *